United States Patent
Standing et al.

(10) Patent No.: US 9,886,156 B2
(45) Date of Patent: *Feb. 6, 2018

(54) RADIOFREQUENCY-WAVE-TRANSPARENT CAPACITIVE SENSOR PAD

(71) Applicant: Microsoft Technology Licensing, LLC, Redmond, WA (US)

(72) Inventors: William Hadlock Standing, Kirkland, WA (US); Marc Harper, Issaquah, WA (US); Sean Russell Mercer, Issaquah, WA (US); David Voth, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/384,742

(22) Filed: Dec. 20, 2016

(65) Prior Publication Data

US 2017/0102802 A1    Apr. 13, 2017

Related U.S. Application Data

(63) Continuation of application No. 14/152,652, filed on Jan. 10, 2014, now Pat. No. 9,563,316.

(51) Int. Cl.
*G06F 3/044* (2006.01)
*H01Q 1/24* (2006.01)
(Continued)

(52) U.S. Cl.
CPC ............. *G06F 3/044* (2013.01); *H01Q 1/243* (2013.01); *H01Q 1/245* (2013.01);
(Continued)

(58) Field of Classification Search
None
See application file for complete search history.

(56) References Cited

U.S. PATENT DOCUMENTS 4,016,490 A    4/1977  Weckenmann et al.
5,166,679 A    11/1992 Vranish et al.
(Continued)

FOREIGN PATENT DOCUMENTS

CN    1179864 A    4/1998
EP    2276108 A1    1/2011
(Continued)

OTHER PUBLICATIONS

"Digital, Silicon Microphone has 2.6 X 1.6mm2 Footprint", Published on: Dec. 28, 2005, Available at: http://news.thomasnet.com/fullstory/Digital-Silicon-Microphone-has-2-6-x-1-6-mm-footprint-471386.
(Continued)

*Primary Examiner* — Kenneth B Lee, Jr.
(74) *Attorney, Agent, or Firm* — Holzer Patel Drennan

(57) ABSTRACT

A capacitive sensor pad is co-located with (e.g., overlapping) an RF transmitter without causing significant degradation to the performance of the antenna. In one implementation, tuning the resistance per square in the capacitive sensor pad can provide effective sensor pad range and performance while providing making the capacitive sensor pad sufficiently transparent to radiofrequency waves to provide excellent antenna efficiency, despite the co-location of the capacitive sensor pad and the antenna.

20 Claims, 10 Drawing Sheets

(51) Int. Cl.
*H03K 17/955* (2006.01)
*H03K 17/945* (2006.01)

(52) U.S. Cl.
CPC ... *H03K 17/955* (2013.01); *H03K 2017/9455* (2013.01); *H03K 2217/94089* (2013.01)

(56) References Cited

U.S. PATENT DOCUMENTS

| | | |
|---|---|---|
| 5,212,621 A | 5/1993 | Panter |
| 7,146,139 B2 | 12/2006 | Nevermann |
| 7,167,093 B2 | 1/2007 | Fergusson |
| 8,324,549 B2 | 12/2012 | Romero et al. |
| 8,432,322 B2 | 4/2013 | Amm et al. |
| 8,466,839 B2 | 6/2013 | Schlub et al. |
| 8,515,496 B2 | 8/2013 | Cheng et al. |
| 8,577,289 B2 | 11/2013 | Schlub et al. |
| 8,922,443 B2 | 12/2014 | Zhu et al. |
| 8,975,903 B2 | 3/2015 | Salter et al. |
| 9,337,833 B2 | 5/2016 | Siska |
| 9,466,872 B2 | 10/2016 | Sanchez et al. |
| 9,563,316 B2* | 1/2017 | Standing ............... G06F 3/044 345/174 |
| 2002/0039028 A1 | 4/2002 | Douglas et al. |
| 2002/0175814 A1 | 11/2002 | Wadlow et al. |
| 2003/0214310 A1 | 11/2003 | McIntosh |
| 2005/0073507 A1* | 4/2005 | Richter ............... G06F 3/044 345/174 |
| 2007/0037619 A1 | 2/2007 | Matsunaga et al. |
| 2009/0033562 A1 | 2/2009 | Takeuchi et al. |
| 2009/0305742 A1* | 12/2009 | Caballero ............ H04B 1/3838 455/566 |
| 2010/0026664 A1 | 2/2010 | Geaghan |
| 2010/0113111 A1 | 5/2010 | Wong et al. |
| 2010/0279751 A1 | 11/2010 | Pourseyed et al. |
| 2010/0321325 A1 | 12/2010 | Springer et al. |
| 2011/0124363 A1 | 5/2011 | Calvarese et al. |
| 2011/0157077 A1 | 6/2011 | Martin et al. |
| 2012/0021707 A1 | 1/2012 | Forrester et al. |
| 2012/0044115 A1 | 2/2012 | McCaughey et al. |
| 2012/0074961 A1 | 3/2012 | Herrmann |
| 2012/0147801 A1 | 6/2012 | Ho et al. |
| 2012/0164962 A1 | 6/2012 | Lin et al. |
| 2012/0172079 A1 | 7/2012 | Baldemair et al. |
| 2012/0178494 A1 | 7/2012 | Haim et al. |
| 2012/0214422 A1 | 8/2012 | Shi et al. |
| 2012/0223865 A1 | 9/2012 | Li et al. |
| 2012/0231784 A1 | 9/2012 | Kazmi |
| 2012/0270519 A1 | 10/2012 | Ngai et al. |
| 2012/0276861 A1 | 11/2012 | Isobe et al. |
| 2012/0298497 A1 | 11/2012 | Maeda et al. |
| 2012/0299772 A1 | 11/2012 | Shtrom et al. |
| 2012/0315847 A1 | 12/2012 | Li et al. |
| 2012/0329517 A1 | 12/2012 | Elin |
| 2012/0329524 A1 | 12/2012 | Kent et al. |
| 2013/0026846 A1 | 1/2013 | Gianesello et al. |
| 2013/0033400 A1 | 2/2013 | Chiang |
| 2013/0045700 A1 | 2/2013 | Stallman et al. |
| 2013/0050046 A1 | 2/2013 | Jarvis et al. |
| 2013/0051261 A1 | 2/2013 | Kazmi et al. |
| 2013/0060517 A1 | 3/2013 | Sanchez |
| 2013/0120257 A1 | 5/2013 | Park et al. |
| 2013/0122827 A1 | 5/2013 | Ali et al. |
| 2013/0169348 A1 | 7/2013 | Shi |
| 2013/0210477 A1 | 8/2013 | Peter |
| 2013/0217342 A1 | 8/2013 | Abdul-gaffoor et al. |
| 2013/0278474 A1 | 10/2013 | Lenormand et al. |
| 2013/0293244 A1 | 11/2013 | Leek |
| 2013/0310105 A1 | 11/2013 | Sagae et al. |
| 2014/0021801 A1 | 1/2014 | Kao et al. |
| 2014/0078094 A1 | 3/2014 | Yang |
| 2014/0139380 A1 | 5/2014 | Ouyang et al. |
| 2014/0370929 A1 | 12/2014 | Khawand et al. |
| 2015/0199042 A1 | 7/2015 | Standing et al. |
| 2015/0200444 A1 | 7/2015 | Mercer et al. |
| 2016/0064801 A1 | 7/2016 | Lee et al. |
| 2016/0204836 A1 | 7/2016 | Lee et al. |

FOREIGN PATENT DOCUMENTS

| | | |
|---|---|---|
| EP | 2383364 | 11/2011 |
| EP | 2568605 A1 | 3/2013 |
| WO | 2012176217 A1 | 12/2012 |
| WO | 2013103948 | 7/2013 |
| WO | 2013169527 A1 | 11/2013 |
| WO | 2015134117 A1 | 9/2015 |
| WO | 2016111897 A1 | 7/2016 |

OTHER PUBLICATIONS

Holopainen, et al., "Broadband Equivalent Circuit Model for Capacitive Coupling Element-Based Mobile Terminal Antenna", In IEEE Antennas and Wireless Propagation Letters, vol. 9, Jul. 8, 2010, 4 pages.

"Low SAR Solution for Tablet PC", Published on: Sep. 27, 2011, Available at: http://www.auden.com.tw/TRC/webspace/disk/AudenSARSolutiondatasheet_110927.pdf.

Ozyalcin, et al., "SAR Simulations in Wireless Communication and Safety Discussions in the Society", In Proceedings of Turkish Journal of Electrical Engineering & Computer Sciences, vol. 10, Issue 2, Dec. 31, 2013, 16 pages.

"Semtech Launches Smart Proximity Sensor for Short-Range Human Presence Detection & SAR Regulations in Mobile & Tablet PC Applications", Published on: Jul. 24, 2012, Available at: http://www.semtech.com/Press-Releases/2012/Semtech-Launches-Smart-Proximity-Sensor-for-Short-Range-Human-Presence-Detection-SAR-Regulations-in-Mobile-Tablet-PC-Applications.html.

Toit, Riaan Du, "Using Proximity Sensing to Meet Mobile Device FCC SAR Reulations", Published on: Apr. 17, 2012, Available at: http://www.eetimes.com/General/PrintView/431201.

"Final Office Action", U.S. Appl. No. 14/152,652, dated Dec. 23, 2015, 9 pages.

"Non-Final Office Action", U.S. Appl. No. 14/152,652, dated Apr. 18, 2016 9 pages.

International Searching Authority, U.S. Patent and Trademark Office, International Search Report and Written Opinion for PCT/US2014/072413, dated Jul. 16, 2015, 16 pages.

International Searching Authority, U.S. Patent and Trademark Office, Second Written Opinion of the International Preliminary Examining Authority for PCT/US2014/072413 dated Dec. 17, 2015, 6 pages.

International Preliminary Examining Authority, International Preliminary Report on Patentability for PCT/US2014/072413, dated Mar. 24, 2016, 7 pages.

Ban, et al., "A Dual-Loop Antenna Design for Hepta-Band WWAN/LTE Metal-Rimmed Smartphone Applications", In Journal of IEEE Transactions on Antennas and Propagation, vol. 63, Issue 1, Jan. 2015, 8 pages.

Chung, et al., "A dual-mode antenna for wireless charging and Near Field Communication", In Proceedings of EEE International Symposium on Antennas and Propagation & USNC/URSI National Radio Science Meeting, Jul. 24, 2015, 5 pages.

Design of Printed Trace Differential Loop Antennas, http://www.silabs.com/Support%20Documents/TechnicalDocs/AN639.pdf, Retrieved on: Nov. 17, 2016, 28 pages.

Mumcu, et al., "Small Wideband Double-Loop Antennas Using Lumped Inductors and Coupling Capacitors", In Journal of IEEE Antennas and Wireless Propagation Letters, vol. 10, Feb. 4, 2011, 5 pages.

Osoinach, Bryce, "Proximity Capacitive Sensor Technology for Touch Sensing Applications", In White Paper of Proximity Sensing, 2007, 7 pages.

Pal, et al., "A low-profile switched-beam dual-band capacitively coupled Square Loop Antenna", In Proceedings of Antennas and Propagation Conference, Nov. 11, 2013, 5 pages.

Pal, et al., "Dual-Band Low-Profile Capacitively Coupled Beam-Steerable Square-Loop Antenna", In Journal of IEEE Transactions

(56) References Cited

OTHER PUBLICATIONS on Antennas and Propagation, vol. 62, Issue 3, Mar. 2014, pp. 1204-1211.
Quddious, et al., "An inkjet printed meandered dipole antenna for RF passive sensing applications", In Proceedings of 10th European Conference on Antennas and Propagation, Apr. 2016, 4 Pages.
Standing, et al., "Radiofrequency-Wave-Transparent Capacitive Sensor Pad", U.S. Appl. No. 15/384,742, filed Dec. 20, 2016, 26 pages.
Harper et al., "Active Proximity Sensor With Adaptive Electric Field Control", U.S. Appl. No. 15/413,196, filed Jan. 23, 2016, 35 pages. Npharper et al., "Active Proximity Sensor With Adaptive Electric Field Control", U.S. Appl. No. 15/413,196, filed Jan. 23, 2016, 35 pages.
Harper, "Loop Antenna With Integrated Proximity Sensing", U.S. Appl. No. 15/412,997, filed Jan. 23, 2016, 32 pages.
"Second Office Action Issued in Chinese Patent Application No. 201380055749.X", dated Jan. 25, 2017, 10 Pages.
"Second Written Opinion Issued in PCT Application No. PCT/US2015/062851", dated Oct. 28, 2016, 8 Pages.
International Preliminary Examining Authority, International Preliminary Report on Patentability for PCT/US2015/062851, dated Feb. 22, 2017, 19 pages.
International Searching Authority, U.S. Patent and Trademark Office, International Search Report and Written Opinion for PCT/US2016/069056, dated Mar. 31, 2017, 17 pages.
"Non-Final Office Action Issued in U.S. Appl. No. 14/152652", dated Jul. 16, 2015, 9 Pages.

\* cited by examiner

RADIOFREQUENCY-WAVE-TRANSPARENT CAPACITIVE SENSOR PAD

The present application is a continuation of and claims benefit of U.S. patent application Ser. No. 14/152,652, filed Jan. 10, 2014 and entitled "RADIOFREQUENCY-WAVE-TRANSPARENT CAPACITIVE SENSOR PAD", which is specifically incorporated by reference for all that it discloses and teaches.

BACKGROUND

Modern electronic devices typically employ high frequency radio communications, particularly mobile devices. Because human tissue can be negatively impacted (e.g., heated) by strong radio waves when the tissue is positioned close to a transmitting antenna, various governmental agencies and industry bodies have established standards to limit the radiofrequency (RF) power that is transmitted into human tissue. For example, a Specific Absorption Rate (SAR) test measures the RF power emitted into human tissue that is located in proximity to the RF transmitter. One approach for satisfying such SAR standards involves reducing the RF transmission power when a body (e.g., a human body part) is detected in close proximity to the RF transmitter. However, integrating proximity sensors and circuitry with radio communication components and computing components in the limited real estate of a mobile device is increasingly challenging as mobile devices continue to evolve (e.g., shrink, add functionality, etc.).

SUMMARY

Implementations described and claimed herein address the foregoing by providing a capacitive sensor pad that can be co-located with (e.g., overlapping) an RF transmitter without causing significant degradation to the performance of the antenna. In one implementation, tuning the resistance per square in the capacitive sensor pad can provide effective sensor pad range and performance while providing making the capacitive sensor pad sufficiently transparent to radiofrequency waves to provide excellent antenna efficiency, despite the co-location of the capacitive sensor pad and the antenna.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

In some jurisdictions, specific absorption rate (SAR) standards impose maximum energy absorption limits on electronic device manufacturers. These standards impose restrictions on the amount of electromagnetic radiation that may be emitted at any particular point within a given distance of a transmitting radio frequency (RF) antenna. Particular attention is given to radiation limits at distances within a few centimeters from the device (e.g., 0-3 centimeters), where users are likely to place a human body part near the transmitting antenna. Such restrictions may be satisfied by reducing transmitted carrier signal strength when a body (e.g., a human body part) is detected in the proximity of the transmitter.

Implementations of the disclosed technology provide an electronic device that dynamically alters the power of a transmitted carrier wave responsive to detected changes in AC voltage waveform at a capacitive sensor pad co-located with an RF transmitter. A change in detected AC voltage waveform at the capacitive sensor pad indicates the proximity of a body (e.g., a human body part) to the capacitive sensor pad. In this manner, detected proximity of a body can be used to dynamically adjust RF transmission power to achieve compliance with SAR standards without significantly compromising the communications performance of the electronic device.

Figure 1:
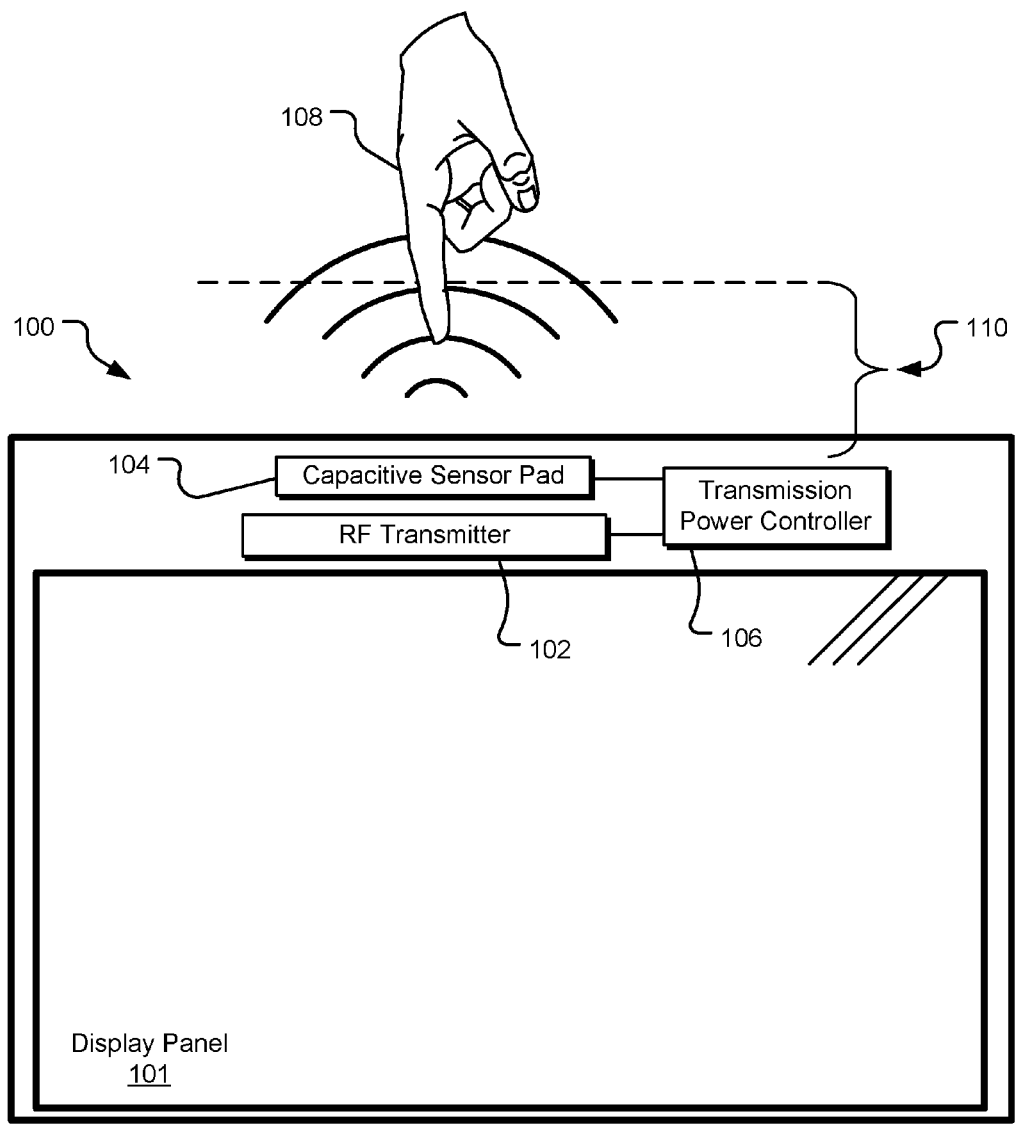
FIG. 1 illustrates an example electronic device that provides for dynamic power adjustment of a transmitted carrier wave responsive to detection of a body or object in close proximity with a capacitive sensor pad co-located with the transmitter.

FIG. 1 illustrates an example electronic device 100 that provides for dynamic power adjustment of a transmitted carrier wave responsive to detection of a body or object (referred to generically as "body") in close proximity with a capacitive sensor pad co-located with the transmitter. The electronic device 100 may be without limitation a tablet computer, laptop, mobile phone, personal data assistant, cell phone, smart phone, Blu-Ray player, gaming system, or any other device including wireless communications circuitry for transmission of an RF carrier wave. The region 101 represents a display panel in the illustrated implementation. The electronic device 100 includes an RF transmitter 102 (including an transmitting antenna) that transmits a carrier wave. In one implementation, the carrier wave has a frequency in the range of a mobile telephone RF transmission (e.g., several hundred megahertz (MHz)). Other implementations are also contemplated. In the illustrated implementation, the electronic device 100 represents a tablet computer having mobile telephone RF capabilities.

The electronic device 100 also includes a capacitive sensor pad 104 co-located with the RF transmitter 102 that is capable of detecting proximity of a body (e.g., a human body part 108) outside the electronic device 100. Because capacitive proximity detection may be based on the presence of a dielectric material within range of a detector, the capacitive sensor pad 104 advantageously detects the proximity of bodies with moderate conductivity, such as, for example, a human hand. Co-located refers to overlapping positioning between the capacitive sensor pad 104 and the RF transmitter 102, whether they are in direct contact or have a thin insulating or non-insulating barrier between them. Various figures are provided that indicate without limitation examples of co-located components.

The capacitive sensor pad 104 has an increased resistance per square when compared to typical capacitive sensor pads, which can provide effective sensor pad range and performance while making the capacitive sensor pad sufficiently transparent to radiofrequency waves to provide excellent antenna efficiency, despite the co-location of the capacitive sensor pad and the antenna. In one implementation, a range of 40-120 k-ohms per square was effective.

In one implementation, the capacitive sensor pad 104 is fed with an AC voltage waveform, such as a square waveform. Capacitance is a property that exists between any two conductive surfaces, and capacitance increases as the distance between the two surfaces decreases. In one configuration, the capacitive sensor pad 104 acts as a first conductive surface and a human body part within a capacitive coupling distance 110 to the capacitive sensor pad 104 acts as a second conductive surface. Changes in the distance between the two conductive surfaces alters the capacitance, resulting in a detectable AC voltage waveform change at the capacitive sensor pad 104 and indicating change in proximity between the capacitive sensor pad 104 and the human body part. For example, the increase in capacitance attributed to the closing of the gap between the human body part and the capacitive sensor pad 104 may introduce a delay in the rising and falling edges of the input oscillating waveform, which can be measured as an indication of the proximity of a body.

By setting a baseline capacitance, measured in free space (e.g., based on the lack of a human body part in the proximity of the capacitive sensor pad 104), and associating that baseline capacitance with a baseline waveform (which may approximate a square waveform), changes in the waveform (e.g., a slower rise or fall time) at the capacitive sensor pad 104 can be detected. These changes indicate a "capacitive delta" at the capacitive sensor pad 104. The capacitive sensor pad 104 is connected to a transmission power controller 106 that provides an electrical feedback path between the capacitive sensor pad 104 and the RF transmitter 102. If the capacitive delta exceeds a predetermined threshold, the transmission power controller 106 may determine that a body, such a human hand, is in proximity to the capacitive sensor pad 104 and therefore is in proximity to the co-located RF transmitter 102. In addition, the transmission power controller 106 includes control circuitry to vary behavior (e.g., output power level, output wave frequency, etc.) of the RF transmitter 102 responsive to the capacitive delta detected by the capacitive sensor pad 104. Therefore, if the transmission power controller 106 determines that a body is in proximity to the RF transmitter 102, the transmission power controller 106 can signal the RF transmitter 102 to reduce its transmission power in an effort to comply with SAR standards.

After altering a behavior of the RF transmitter 102, the transmission power controller 106 continues to monitor the waveform received by the capacitive sensor pad 104. If the body begins to move away from the capacitive sensor pad 104, the capacitive coupling between the capacitive sensor pad 104 and the body changes toward the baseline capacitance, as indicated by the waveform at the capacitive sensor pad 104.

Different types of waveforms and concepts may be used in connection with the capacitive sensor pad 104. For example, as described above, the waveform may be a square wave with variable rise and fall times that vary with the effective capacitance, and therefore the proximity, of a proximate body. Alternatively, a sinusoid wave may be applied to capacitive sensor pad 104. The frequency of the sinusoid wave may vary depending on the effective capacitance, and therefore the proximity, of a proximate body. A phase-locked loop or other timing circuit may be used to measure the frequency of the sinusoid wave to, in turn, determine the proximity of a body or object. Any type of waveform may be used, including a sine wave, square wave, saw tooth wave, or a wave that is combination of sine waves.

Figure 2:
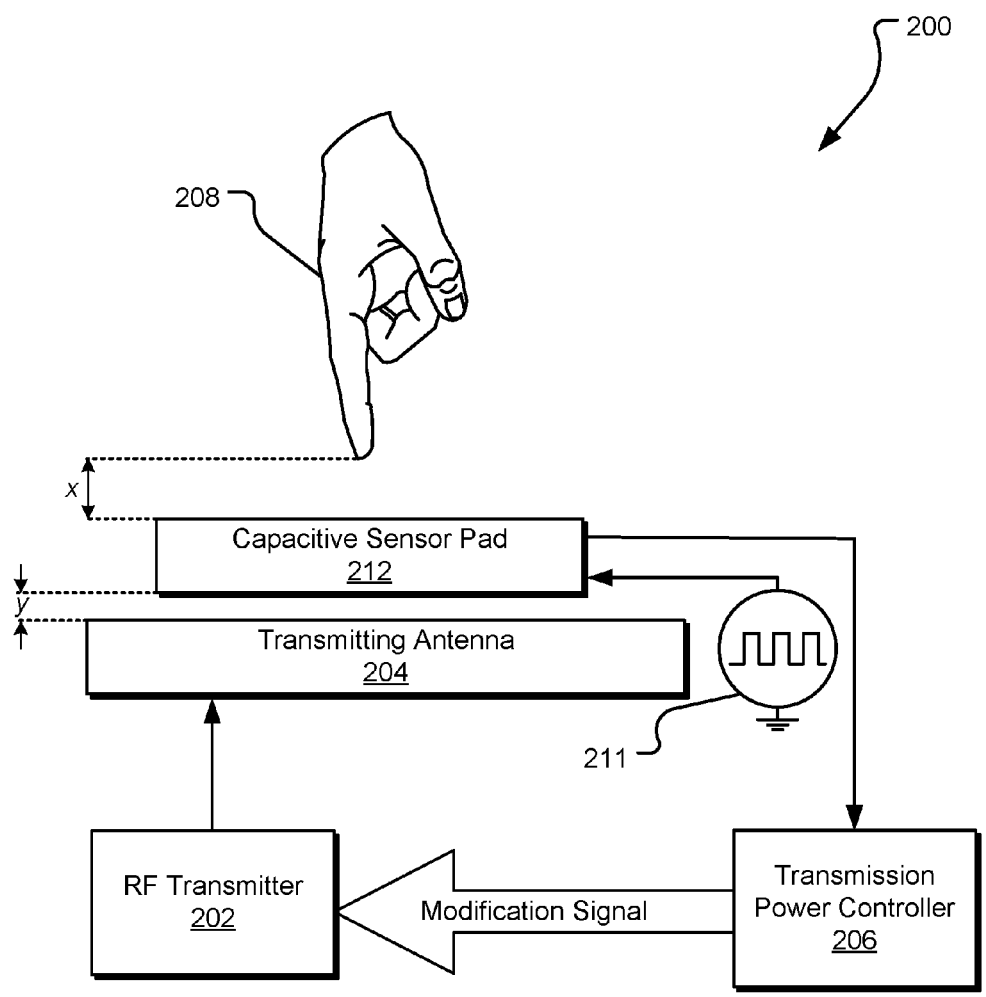
FIG. 2 illustrates an example wireless transmission system having a capacitive sensor pad co-located with an RF transmitting antenna.

FIG. 2 illustrates an example wireless transmission system 200 having a capacitive sensor pad 212 co-located with an RF transmitting antenna 204. The wireless transmission system 200 includes an RF transmitter 202 that generates a carrier wave, such as a mobile telephone RF signal. The RF transmitter 202 is coupled to an RF transmitting antenna 204 that wirelessly transmits the carrier wave. The transmitting antenna 204 may be embedded within, positioned beneath, or located on a surface of an electronic device. Other implementations may also be employed.

The wireless transmission system 200 includes a capacitive sensor pad 212 coupled to a transmission power controller 206. The capacitive sensor pad 212 is supplied with an AC signal waveform from an AC voltage source 211 to detect the proximity of bodies. (The AC voltage source 211 and the transmission power controller 206 may be integrated components, which have an integrated connection to the capacitive sensor pad 212.) The tissue of a human body includes conductive electrolytes and water molecules, which exhibit non-zero conductivity. The AC signal waveform creates an electric field at the capacitive sensor pad 212. As a body 208, such as a human finger, approaches the capacitive sensor pad 212, the body 208 interacts with the electric fields. The gap x between the capacitive sensor pad 212 and the body 208 decreases, increasing the capacitance delta at the capacitive sensor pad 212. If the capacitance delta is represented by a change in the AC signal waveform (e.g., a change in amplitude, frequency, or rise/fall times of the AC signal waveform). The altered AC signal waveform is provided to the transmission power controller 206, which evaluates the AC signal waveform for a capacitance delta that would indicate proximity of a body. If such proximity is detected, the transmission power controller 206 provides an electrical feedback path to the RF transmitter 202, allowing for dynamic modification of behavior (e.g., transmission power) of the RF transmitter 202 to reduce a human health risk posed by the carrier wave signal strength. This behavior modification of the RF transmitter 202 may be achieved in a number of ways, such as through a digital logic control line or a communication signal over a digital communication interface bus.

When the body begins to move away from the transmitting antenna 204, the capacitive coupling between the capacitive sensor pad 204 and the body decreases. The capacitance at the capacitive sensor pad 212 decreases, and the AC signal waveform begins to return to the base line. If the capacitive delta at the capacitive sensor pad 212 drops back below the threshold power change condition, the transmission power controller 206 increases the transmission power of the RF transmitter 202 to the original transmission power level.

The transmission power controller 206 may store or have access to a number or spectrum of different threshold power change conditions. Depending on the particular threshold power change condition satisfied, the transmission power controller 206 may modify behavior of the RF transmitter 202 differently. For example, the transmission power controller 206 may be capable of increasing or decreasing transmission power of the RF transmitter 202 by a variety of different magnitudes, depending on the capacitive delta at the capacitive sensor pad 212.

The capacitive sensor pad 212 is co-located with the transmitting antenna 204, separated by a distance y, which may be zero or non-zero (e.g., 0-3 millimeters). For example, the capacitive sensor pad 212 may be placed directly on the transmitting antenna 204. Alternatively, a non-conducting layer may be placed between the capacitive sensor pad 212 and the transmitting antenna 204.

Figure 3:
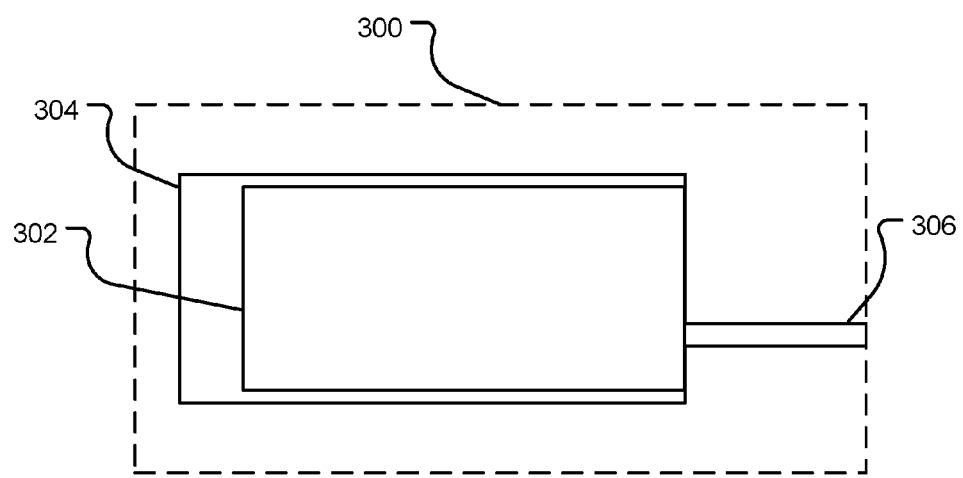
FIG. 3 illustrates an antenna volume having a capacitive sensor pad co-located with an RF transmitting antenna.

FIG. 3 illustrates an antenna volume 300 having a capacitive sensor pad 302 co-located with an RF transmitting antenna 304. The capacitive sensor pad 302 overlaps and is within the areal dimensions of the RF transmitting antenna 304. Within the antenna volume 300, a conductive trace 306 extends from the capacitive sensor pad 302 to a SAR circuit (e.g., a transmission power controller) to monitor capacitance changes at the capacitive sensor pad 302. In one implementation, the RF transmitting antenna 304 is fixed in a non-conductive supporting structure (e.g., made of plastic). In another implementation, the capacitive sensor pad 302 and RF transmitting antenna 304 may be constructed as a multilayer flexible printed circuit (FPC), where the capacitive sensor pad 302 is on one side of the FPC, facing the exterior of the electronic device in which the antenna volume 300 resides, and the RF transmitting antenna 304 is one of the layers located more interior than the capacitive sensor pad 302. In yet another implementation, the RF transmitting antenna 304 may be printed on a former (e.g., using a laser direct structuring (LDS) process), with a capacitive sensor pad 302 co-located on the RF transmitting antenna 304, facing the exterior of the electronic device. Other implementations may be employed.

The capacitive sensor pad 302, in one implementation, is microwave-transparent, made of screened-on polyester material with embedded carbon laid out in 10 to 40 micrometer thick sheets, although other materials and dimensions may be employed. A range of 40k-ohm to 500k-ohm per square resistivity may be employed in certain implementations, although certain ranges may be employed for particular configurations. The materials for the capacitive sensor pad 302 may be applied as a conductive film, a conductive adhesive, and materials that are sprayed, sputtered, or applied by other means.

Figure 4:
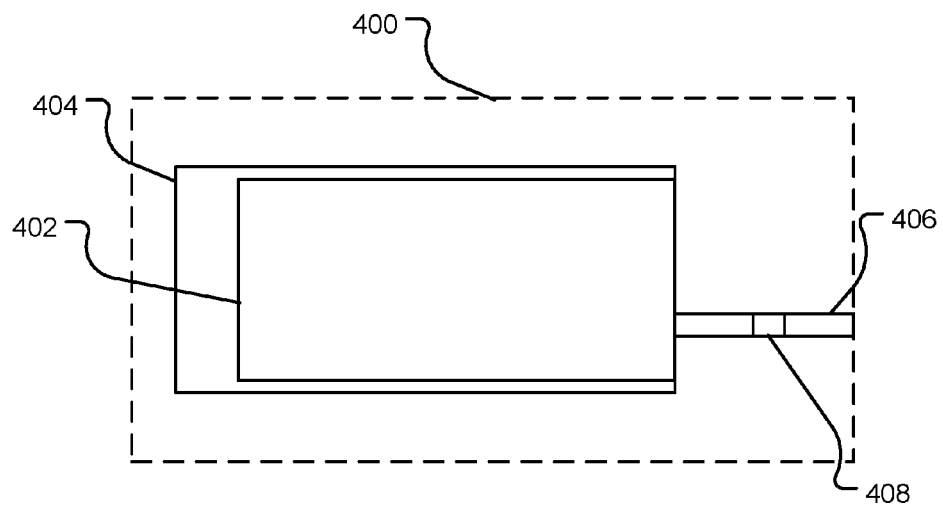
FIG. 4 illustrates an antenna volume having a capacitive sensor pad co-located with an RF transmitting antenna with a segmented resonating conductor trace.

FIG. 4 illustrates an antenna volume 400 having a capacitive sensor pad 402 co-located with an RF transmitting antenna 404 with a segmented resonating conductor trace 406. Within the antenna volume 400, a segmented resonating conductive trace 406 extends from the capacitive sensor pad 402 to a SAR circuit (e.g., a transmission power controller) to monitor capacitance changes at the capacitive sensor pad 402. Without segmentation, the segmented resonating conductive trace 406 can form an RF resonator that introduces resonances into operating frequency bands of the RF transmitting antenna 404 and impair antenna performance. Accordingly by segmenting the segmented resonating conductive trace 406 (e.g., by introduction of one or more resistors 408), the resonances caused by the conductive trace can be moved out of the operating frequency bands of the RF transmitting antenna 404. An example segmenting resistor value may include a 10K ohm chip resistor, although other resistor types and values may be employed.

Segmenting the conductive trace 406 creates shorter conductive resonators in the trace isolated by a high value resistor. Each shorter metal segment is designed to resonate at a different (e.g., higher) frequency than the operating frequency bands of the RF transmitting antenna 404. Multiple such resistors may be employed to create more than two trace segments.

Figure 5:
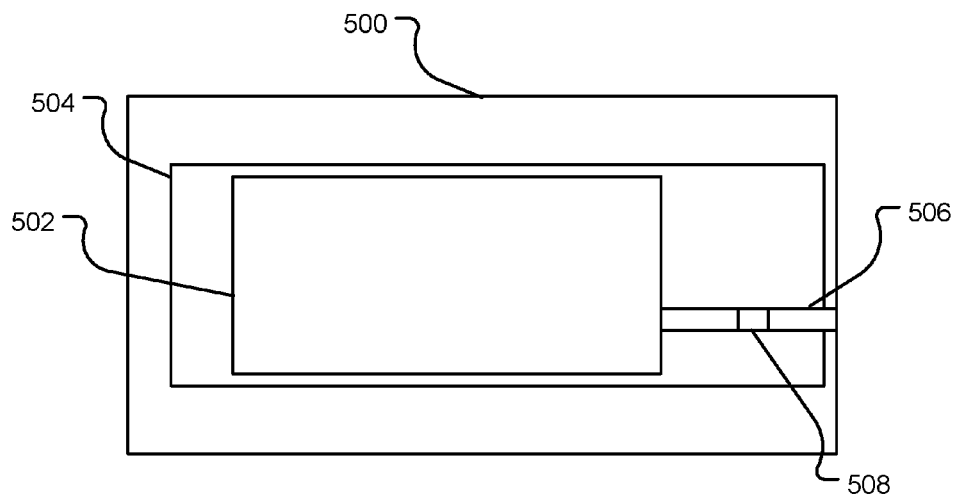
FIG. 5 illustrates an antenna volume having a capacitive sensor pad co-located with an RF transmitting antenna with a segmented resonating conductor overlapping the RF transmitting antenna.

FIG. 5 illustrates an antenna volume 500 having a capacitive sensor pad 502 co-located with an RF transmitting antenna 504 with a segmented resonating conductor 506 overlapping the RF transmitting antenna 504. Within the antenna volume 500, a segmented resonating conductive trace 506 extends from the capacitive sensor pad 502 to a SAR circuit (e.g., a transmission power controller) to monitor capacitance changes at the capacitive sensor pad 502. Such a configuration can introduce severe coupling between the conductive trace 506 and the RF transmitting antenna 504.

Without segmentation, the segmented resonating conductive trace 506 can form an RF resonator that introduces resonances into operating frequency bands of the RF transmitting antenna 504 and impair antenna performance. Furthermore, in contrast to the configuration discussed with regard to FIG. 4, the RF transmitting antenna 504 extends farther to the right, further exacerbating the potential problem with RF resonances in the operating frequency bands of the RF transmitting antenna 504 (e.g., caused by the segmented resonating conductor 506 overlapping the RF transmitting antenna 504). Accordingly by segmenting the segmented resonating conductive trace 506 (e.g., by introduction of one or more resistors 508), the resonances caused by the conductive trace can be moved out of the operating frequency bands of the RF transmitting antenna 504.

Figure 6:
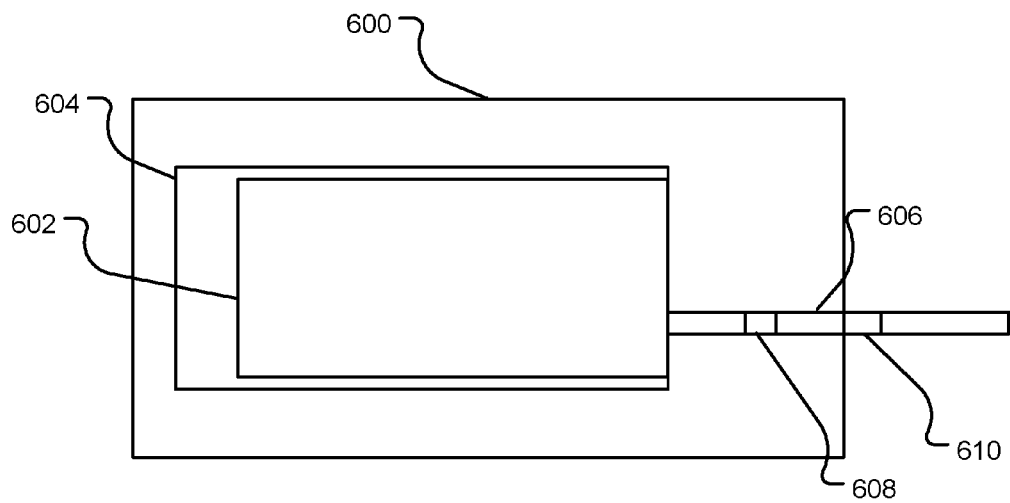
FIG. 6 illustrates an antenna volume having a capacitive sensor pad co-located with an RF transmitting antenna with a segmented resonating conductor overlapping the RF transmitting antenna and a noise blocking chip resistor.

FIG. 6 illustrates an antenna volume 600 having a capacitive sensor pad 602 co-located with an RF transmitting antenna 604 with a segmented resonating conductor 606 overlapping the RF transmitting antenna 604 and a noise blocking chip resistor 610. Within the antenna volume 600, a segmented resonating conductive trace 606 extends from the capacitive sensor pad 602 to a SAR circuit (e.g., a transmission power controller) to monitor capacitance changes at the capacitive sensor pad 602.

Without segmentation, the segmented resonating conductive trace 606 can form an RF resonator that introduces resonances into operating frequency bands of the RF transmitting antenna 604 and impair antenna performance. Furthermore, in contrast to the configuration discussed with regard to FIG. 4, the RF transmitting antenna 604 extends farther to the right, further exacerbating the potential problem with RF resonances in the operating frequency bands of the RF transmitting antenna 604 (e.g., caused by the segmented resonating conductor 606 overlapping the RF transmitting antenna 604). Accordingly by segmenting the segmented resonating conductive trace 606 (e.g., by introduction of one or more resistors 608), the resonances caused by the conductive trace can be moved out of the operating frequency bands of the RF transmitting antenna 604.

Furthermore, the segmented conductive trace 606 from the SAR circuit may be noisy. As a result, FIG. 6 introduces a noise blocking chip resistor 610 outside the antenna volume to block noise from the SAR circuit and the conductive trace. Example resistors 610 may include 0201 or 0402 sized 10k ohm chip resistors, although other resistive elements may be employed. The noise blocking chip resistor 610 blocks noise on the conductive trace 606 from reaching the RF transmitting antenna 604.

Figure 7:
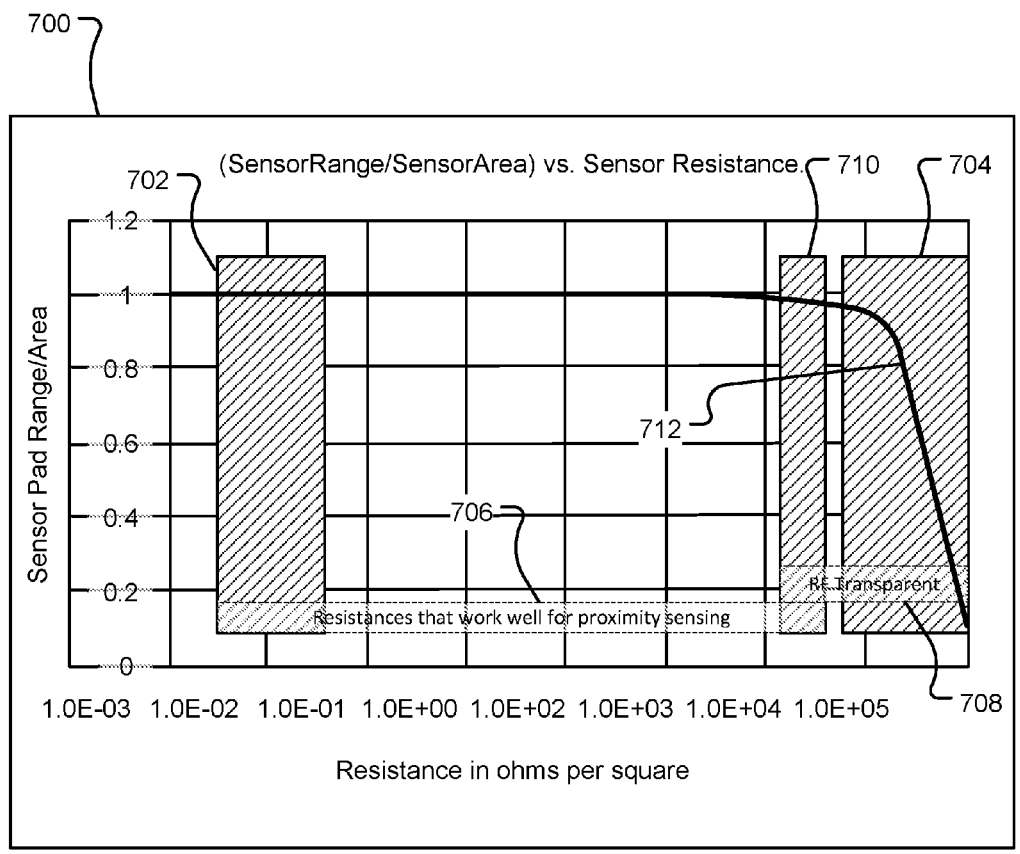
FIG. 7 illustrates an example relationship between capacitive sensor pad range/area and sensor resistance.

FIG. 7 illustrates an example relationship 700 between capacitive sensor pad range/area (Y-axis) and sensor resistance (X-axis). The plot 712 indicates the performance of a capacitive sensor pad relative to its resistivity. The hashed region 702 generally represents a range of materials having a resistance that classified the materials as good "conductors." The hashed region 704 generally represents a range of materials having a resistance that classified the materials as good "insulators." The dashed box 706 represents a range of resistance found to work well for capacitive proximity sensing in capacitive sensor pads. The dashed box 708 represents a range of resistance found to be relatively RF transparent. Accordingly, the overlapping regions from box 706 and 708 indicate the hashed region 710, which generally represents a range of materials having a resistance that classified the materials as sufficiently efficient at sensing proximity while remaining transparent to radiofrequency waves.

Figure 8:
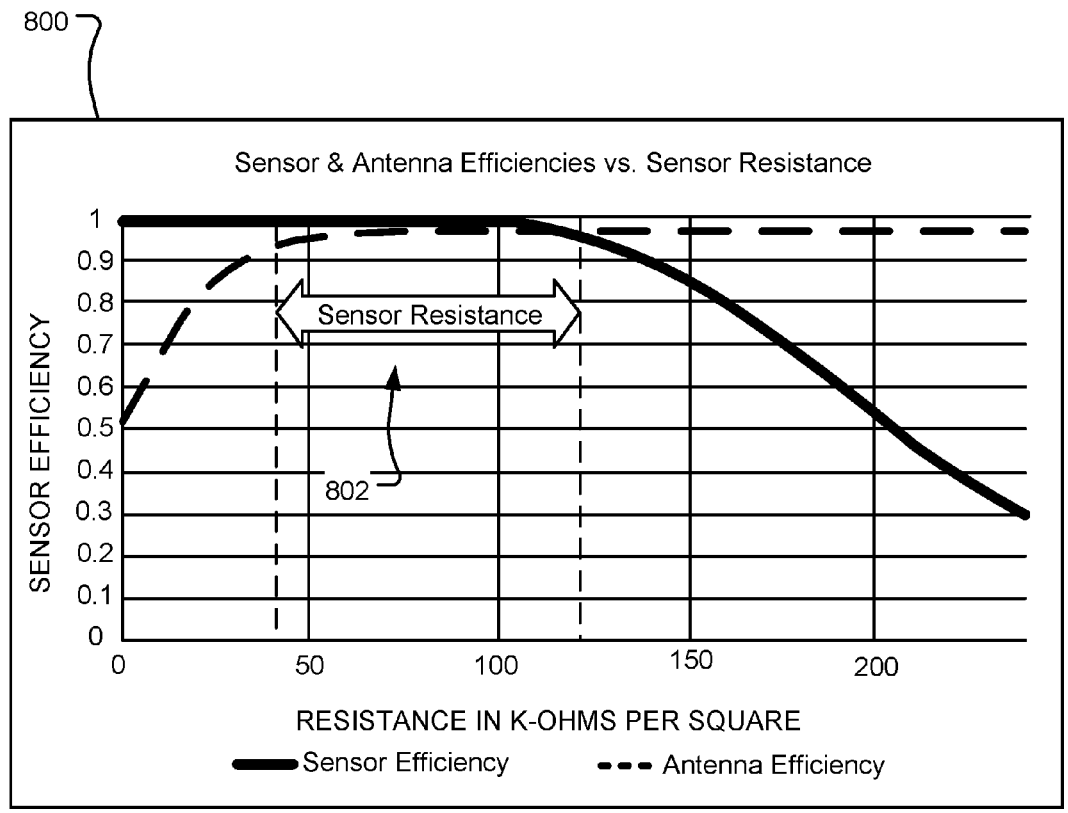
FIG. 8 illustrates an example relationship of sensor and antenna efficiencies relative to sensor resistance.

FIG. 8 illustrates an example relationship 800 of sensor and antenna efficiencies relative to sensor resistance. The region 802 indicates the resistivity range in which sensor efficiency and antenna efficiency are generally at near their maximums within the same resistivity range (e.g., 40k ohms/sq to 120k ohms/sq), although acceptable operating results may be achieved outside of this range, as shown by the relatively slow decline of sensor efficiency above 120k ohms/sq.

Figure 9:
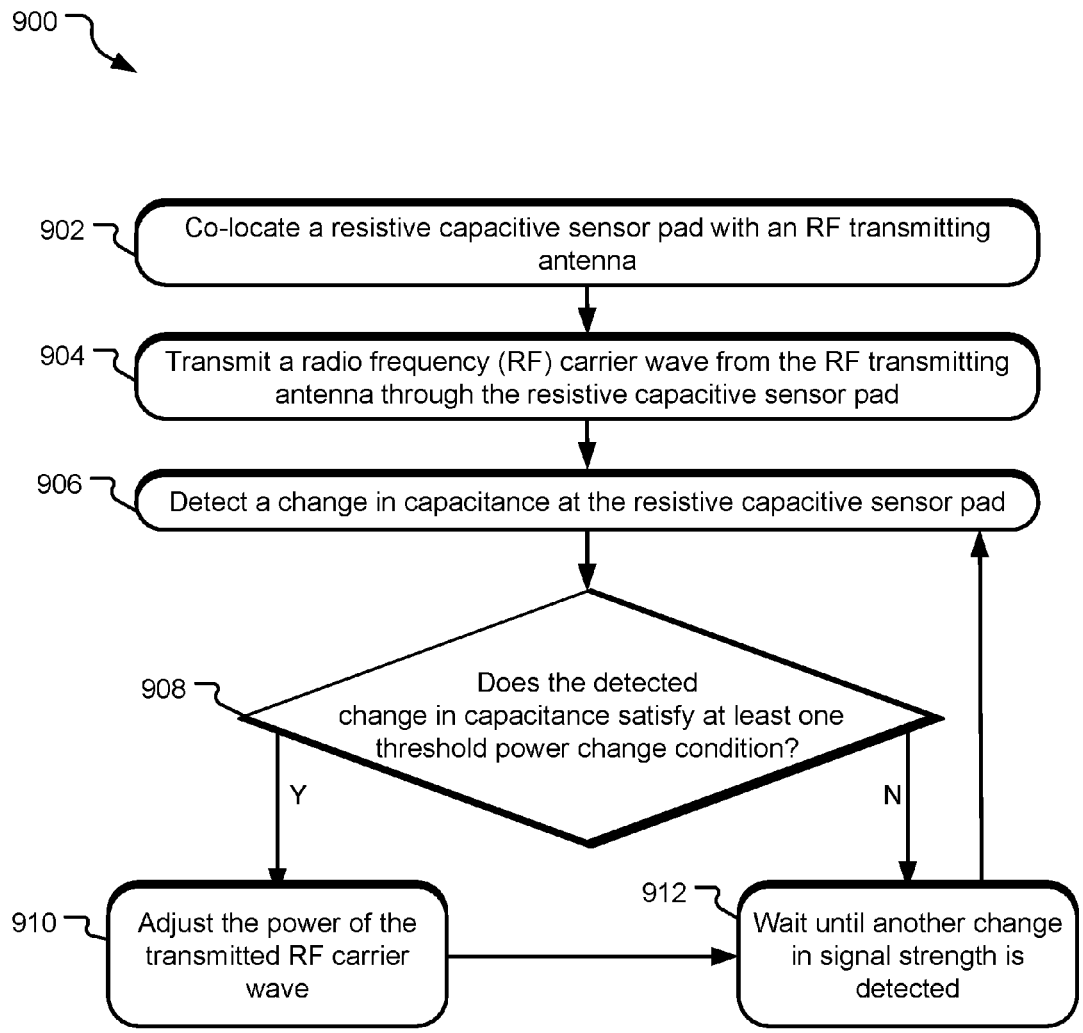
FIG. 9 illustrates example operations for using a capacitive sensor pad co-located with an RF transmitting antenna for dynamic power adjustment of a transmitted carrier wave.

FIG. 9 illustrates example operations 900 for using a capacitive sensor pad co-located with an RF transmitting antenna for dynamic power adjustment of a transmitted carrier wave. A construction operation 902 co-locates a resistive capacitive sensor pad with an RF transmitting antenna in an electronic device. A transmission operation 902 transmits an RF carrier wave, such as a mobile telephone RF signal, through the resistive capacitive sensor pad. A detecting operation 904 detects proximity of a body based on a change in capacitance sensed by the resistive capacitive pad.

A determination operation 908 determines whether the detected change in the capacitance at the capacitive sensor pad satisfies at least one threshold power change condition. Threshold power change conditions may be stored in memory locations accessible by an RF power detector of the wireless transmission system.

If the detected change in capacitance at the capacitive sensor pad satisfies a threshold power change condition, additional analysis may be performed to determine an appropriate responsive action. Based on this analysis, a responsive action can be identified and implemented.

If the determination operation 908 determines that the capacitance change at the capacitive sensor pad satisfies at least one threshold power change condition, an adjustment operation 910 adjusts the power of the transmitted RF carrier wave. The degree of the power adjustment may depend on the magnitude of the detected change capacitance at the capacitive sensor pad. After the adjustment operation 910 adjusts the power of the transmitted RF carrier wave, a waiting operation 912 is assumed until another change in capacitance at the capacitive sensor pad is detected by the detection operation 906.

If the determination operation 908 determines that the change in capacitance at the capacitive sensor pad does not satisfy a threshold power change condition, the adjustment operation 910 is not executed. Rather, the waiting operation 912 is assumed until another change in capacitance at the capacitive sensor pad is detected by the detection operation 906.

Figure 10:
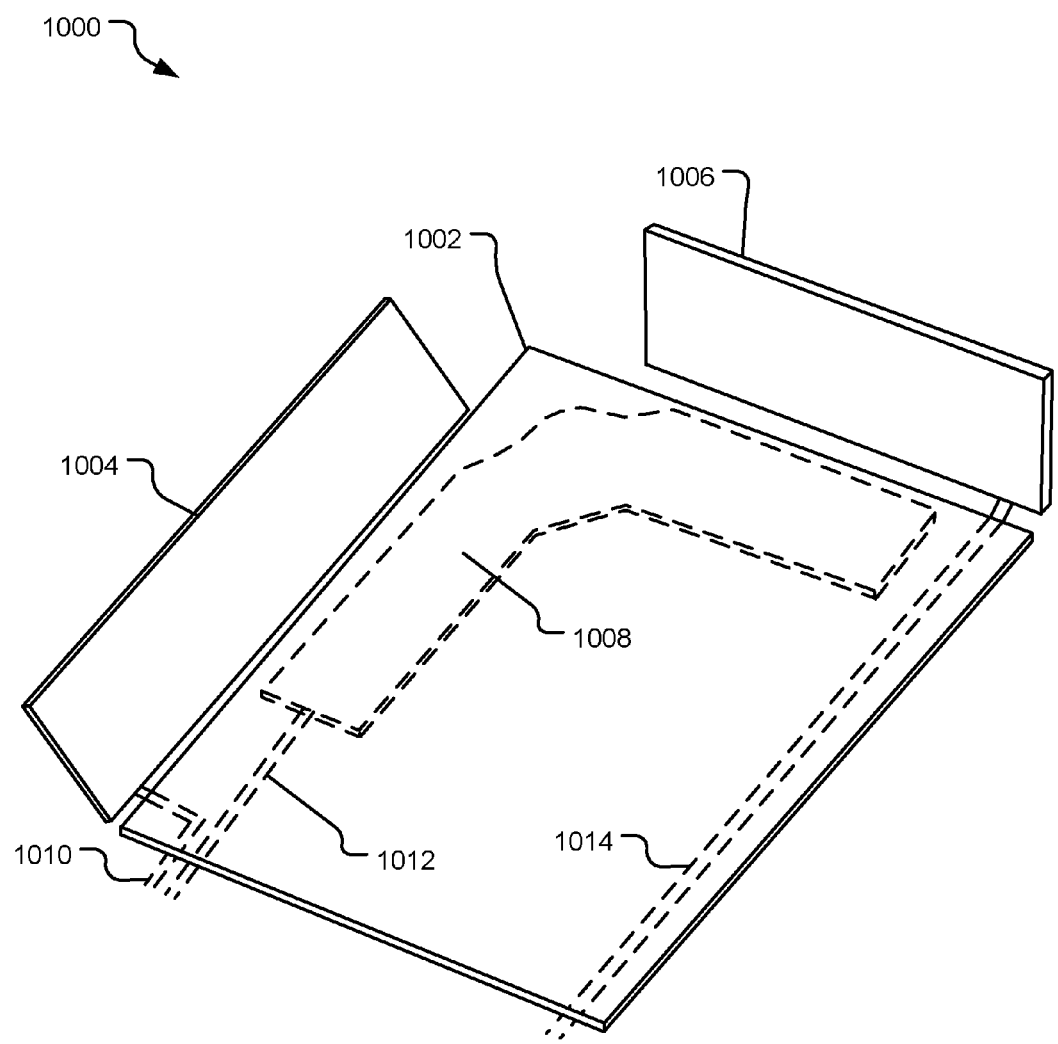
FIG. 10 illustrates a 3-sensor pad implementation detecting proximity to a transmitting antenna.

FIG. 10 illustrates a 3-sensor pad implementation 1000 detecting proximity to a transmitting antenna 1002. The capacitive sensor pads 1004, 1006, and 1008 are generally orthogonal to each other, and overlap/surround the dimensions of the transmitting antenna 1002 (e.g., co-locating three sensor pads 1004, 1006, and 1008 with the transmitting antenna). (Although the sensor pads 1004, 1006, and 1008 are not shown as perfectly orthogonal, so as to fit within the profile of a computing device case having sides that are not perfectly orthogonal, they are sufficiently orthogonal to discern proximity signals from multiple axes, e.g., X, Y, and Z). The sensor pads 1004, 1006, and 1008 connected to a transmission power controller (not shown) by traces 1010, 1012, and 1014. Because the sensor pads monitor the three different axes, the transmission power controller can infer direction of the proximal external object. Furthermore, capacitance measurement drive, cause by temperature and humidity deltas, are easier to separate from the proximity signal when the multiple sensor pads 1004, 1006, and 1008 all drift together.

The capacitive sensor pads 1004, 1006, and 1008 are highly resistive, as discussed previously with regard to other capacitive sensor pads described herein. The traces 1010, 1012, and 1014 may include segmenting resistors and noise blocking resistors, as discussed with regard to the previously described implementations.

The implementations of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the invention. Since many implementations of the invention can be made without departing from the spirit and scope of the invention, the invention resides in the claims hereinafter appended. Furthermore, structural features of the different embodiments may be combined in yet another implementation without departing from the recited claims.

What is claimed is:
1. An electronic device comprising:
   a capacitive sensor pad configured to detect proximity of a body outside the electronic device, the capacitive sensor pad having transparency to radiofrequency waves; and a radiofrequency antenna overlapping the capacitive sensor pad and configured to transmit radiofrequency through the capacitive sensor pad.

2. The electronic device of claim 1 further comprising:
a conductive trace extending from the capacitive sensor pad to outside an antenna volume; and
one or more segmenting resistors in the conductive trace configured to move signal resonances within the conductive trace outside of operating bands of the radiofrequency antenna.

3. The electronic device of claim 1 further comprising:
a conductive trace extending from the capacitive sensor pad to outside an antenna volume and overlapping a portion of the radiofrequency antenna; and
one or more segmenting resistors in the conductive trace within the antenna volume configured to move signal resonances within the conductive trace outside of operating bands of the radiofrequency antenna.

4. The electronic device of claim 1 further comprising:
a conductive trace extending from the capacitive sensor pad to outside an antenna volume and overlapping a portion of the radiofrequency antenna; and
a noise-blocking resistor in the conductive trace outside the antenna volume.

5. The electronic device of claim 1 further comprising:
a radiofrequency transmitter coupled to the radiofrequency antenna; and
a transmission power controller coupled to the capacitive sensor pad and the radiofrequency transmitter and configured to adjust transmission power of the radiofrequency transmitter when the capacitive sensor pad exhibits a change in a capacitance.

6. The electronic device of claim 1 further comprising:
a planar radiofrequency transmitter coupled to the radiofrequency antenna; and
a transmission power controller coupled to the capacitive sensor pad and the planar radiofrequency transmitter and configured to increase transmission power of the planar radiofrequency transmitter when the capacitive sensor pad exhibits a change in a capacitance that no longer satisfies a threshold power change condition.

7. The electronic device of claim 1 further comprising:
a radiofrequency transmitter coupled to the radiofrequency antenna; and
a transmission power controller coupled to the capacitive sensor pad and the radiofrequency transmitter and configured to decrease transmission power of the radiofrequency transmitter when the capacitive sensor pad exhibits a change in a capacitance that satisfies a threshold power change condition.

8. The electronic device of claim 1 wherein the capacitive sensor pad has a resistivity above 40,000 ohms/square.

9. The electronic device of claim 8 wherein increased resistivity of the capacitive sensor pad results in increased transparency of the capacitive sensor pad to radiofrequency waves.

10. The electronic device of claim 1 wherein the capacitive sensor pad is directly affixed to the radiofrequency antenna.

11. The electronic device of claim 1 wherein the capacitive sensor pad overlaps and is separated from the radiofrequency antenna by no more than 3 mm.

12. The electronic device of claim 1 wherein the capacitive sensor pad overlaps and is within the areal dimensions of the radiofrequency antenna.

13. A method comprising:
constructing a capacitive sensor pad that is overlapping a radiofrequency antenna, the capacitive sensor pad having resistivity-dependent transparency to radiofrequency waves, wherein the radiofrequency antenna is positioned to transmit radiofrequency waves through the capacitive sensor pad and the capacitive sensor pad is configured to detect proximity of a conducting body.

14. The method of claim 13 further comprising:
transmitting the radiofrequency waves from the radiofrequency antenna through the capacitive sensor pad.

15. The method of claim 13 further comprising:
detecting a body in the proximity of the capacitive sensor pad; and
adjusting transmission power of a radiofrequency transmitter exiting the radiofrequency antenna when the capacitive sensor pad exhibits a change in a capacitance.

16. The method of claim 13 wherein the capacitive sensor pad has a resistivity above 40,000 ohms/square.

17. The method of claim 16 wherein increased resistivity of the capacitive sensor pad results in increased transparency of the capacitive sensor pad to radiofrequency waves.

18. The method of claim 13 wherein the capacitive sensor pad is directly affixed to the radiofrequency antenna.

19. An electronic device comprising:
a capacitive sensor pad configured to detect proximity of a body outside the electronic device, the capacitive sensor pad having transparency to radiofrequency waves based on resistivity of the capacitive sensor pad;
a first surface of a dielectric adjacent to the capacitive sensor pad; and
a second surface of a dielectric adjacent to an antenna, the antenna overlapping the capacitive sensor pad and configured to transmit radiofrequency signals through the capacitive sensor pad.

20. The electronic device of claim 19 wherein the capacitive sensor pad is a first capacitive sensor pad, the electronic device further comprising:
a second capacitive sensor pad placed substantially orthogonally to the capacitive first sensor pad.

* * * * *